United States Patent
Kuo et al.

(10) Patent No.: US 6,727,180 B2
(45) Date of Patent: Apr. 27, 2004

(54) METHOD FOR FORMING CONTACT WINDOW

(75) Inventors: Chien-Li Kuo, Hsin-Chu (TW); Wei-Wu Liao, Taipei (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/839,365

(22) Filed: Apr. 23, 2001

(65) Prior Publication Data

US 2001/0046782 A1 Nov. 29, 2001

Related U.S. Application Data

(63) Continuation-in-part of application No. 09/245,882, filed on Feb. 6, 1999, now abandoned.

(51) Int. Cl.[7] .............................................. H01L 21/301
(52) U.S. Cl. .................................... 438/701; 438/723
(58) Field of Search ................................ 438/735, 737, 438/738, 739, 700, 706, 710, 701, 702, 703, 723

(56) References Cited

U.S. PATENT DOCUMENTS

| | | | | |
|---|---|---|---|---|
| 3,800,412 A | * | 4/1974 | Wall et al. ........... | 148/DIG. 28 |
| 4,299,862 A | * | 11/1981 | Donley .............. | 148/DIG. 106 |
| 4,808,259 A | * | 2/1989 | Jillie et al. ...................... | 134/2 |
| 5,449,314 A | * | 9/1995 | Meikle et al. .............. | 438/633 |
| 5,591,675 A | * | 1/1997 | Kim et al. .................. | 438/640 |
| 5,821,141 A | * | 10/1998 | Huang ........................ | 438/253 |
| 5,836,805 A | * | 11/1998 | Obeng .......................... | 451/36 |
| 5,849,635 A | * | 12/1998 | Akram et al. ............... | 438/704 |
| 6,335,275 B1 | * | 1/2002 | Yabata et al. ............... | 438/639 |

* cited by examiner

*Primary Examiner*—Kin-Chan Chen
(74) *Attorney, Agent, or Firm*—Bacon & Thomas, PLLC

(57) ABSTRACT

A method for forming contact window is disclosed. Essential concept of the invention comprises over coating layer formed over surface before forming contact window is formed and the etching rate of over coating layer is higher than etching rate of underlying layer. The method comprises following steps: First, forming semiconductor structures on surface of wafer. Second, forming a coating layer over the surface and covering these semiconductor structures. Third, forming an over coating layer on the coating layer, where etching rate of over coating layer is higher than etching rate of coating layer. Finally, form contact window with outwardly winded shape. Thus, contact window formed by the invention is more convenient for filling material than contact window formed by conventional method. In addition, because width of contact window is not obviously increased, this invention is more beneficial for deep-submicron fabrication.

16 Claims, 2 Drawing Sheets

METHOD FOR FORMING CONTACT WINDOW

This application is a continuation-in-part of U.S. patent application Ser. No. 09/245,882, filed Feb. 6, 1999, now abandoned the entire disclosure of which is herein incorporated by reference.

BACKGROUND OF THE INVENTION

1. Field of the Invention

The present invention relates to a method for forming contact window, and more specifically to a method that coating an over coating layer before forming contact window, where over coating layer has a higher etching rate than underlying layer, to let the contact window is outwardly widened.

2. Description of the Prior Art

Contact is broadly used in semiconductor fabrication to form metal plug, interconnect or other semiconductor structures. Formation of contact comprises: formation of a contact window on a surface, and fill material in the contact window to form the contact. Although the forming process of contact window comprises photolithography and etching, size of contact window is restricted with contemporary techniques, the restriction is not strict for even in deep-submicron fabrication. It is improved by application of deep UV, electron beam and X-ray, and then size of contact window is decreased as integration of integrated circuits (IC) is increased.

No matter how, although width of contact window is decreased as integration is increased, thickness of contact window is still restricted in a finite range for heights of related semiconductor elements still are not negligible. For example, typical thickness of contact window of logic IC is about 1 micron. Nevertheless, for memory IC there are both gate and capacitor and then typical thickness of contact window is about 2 micron to 2.5 micron. Thus, aspect ratio is increased as scale of semiconductor element is minimized and then step coverage of filled material is degraded.

An example of conventional contact is shown in FIG. 1A, where a coating layer 12 is formed over a surface of wafer 10 and then a contact window is formed by etching. Finally, material 14 is filled in the contact window.

Obviously, as aspect of contact window is increased, over hang 16 and void 18 are unavoidable and then qualify of contact is degraded. For example, if contact is a metal plug, high aspect may let the contact window is closed by over hang and then bottom of contact window is not filled by metal. Thus, the metal plug is not useful to conduct current.

A direct solution to reduce aspect is increasing width of contact width, especially while height of contact window is restricted by heights of semiconductor structures. By the way, because outline of contact window is a main factor that affects how material is filled in the contact window, another conventional contact window is shown in FIG. 1B, where coating layer 12 is formed on surface of wafer 10 and contact window is formed by anisotropic etching. Obviously, step coverage of material 14 is improved and there is no overhang or void if sidewall of contact window is enough lean. No matter how, allowable width of contact window is strongly limited by the increased integration. Because each contact must be isolated with other contacts or semiconductor elements, there is a lowest limitation of distance between each contact and other contacts or semiconductor element. Obviously, width of contact window is limited by specific critical dimension, and then aspect still is increased as thickness of contact window is increased.

For these foregoing reasons, obviously, it is important to form a contact without disadvantage such as void or overhang. In addition, it is urgent to solve the problem without obviously increase width of contact window, which is more important in the high-integrated semiconductor fabrication.

SUMMARY OF THE INVENTION

The present invention provides a method to form contact window. Essential concepts of this invention comprises: over coating layer is formed before the contact window is formed, where the etching rate of over coating layer is higher than etching rate of underlying structure. Thus, owing to it is more facile to remove over coating layer, the cross-section of contact window is wider in the over coating layer than the cross-section of contact window in the underlying structure.

First embodiment is a method for forming contact window. Provided method comprise following steps: First, form some semiconductor structures on surface of wafer and then form a coating layer surface of wafer, where thickness of coating layer is equal to or higher than height of semiconductor structures. Next, form an over coating layer over coating layer, where etching rate of over coating layer is higher than etching rate of coating layer. Then, form a contact window in both over coating layer and coating layer, where upper part of contact window is outwardly widened.

This embodiment at least could be optionally modified as following: planarize underlying structure before over coating layer is formed, form contact window by etching process, viscosity of over coating layer is larger than underlying structure; and upper part of contact window could be oblique, crooked, or smooth.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2A:
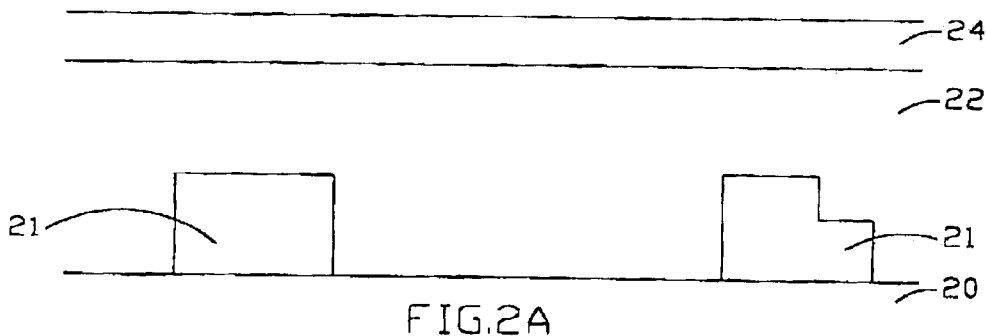
FIG. 2A to FIG. 2C show cross-sectional views illustrations of different stages in the formation of contact window in accordance with one embodiment of the present invention.

According to first embodiment, a method for forming contact window is provided to form a contact window with an outline that is convenient for filling material into the contact window and is effective to eliminate formation of over hang and voids. Refers to FIG. 2A to FIG. 2C, the embodiment comprise following steps:

First of all, as shown in FIG. 2A, form numerous semiconductor structures 21 on the surface of wafer 20, where semiconductor structures 21 comprises gate, electrode of capacitor, isolation layer, and multilevel interconnects. Then, form a coating layer 22 over the surface of wafer 20 to protect these semiconductor structures 21, where coating layer 22 comprises dielectric layer and [depth] thickness of coating layer 22 is equal to or higher than heights of semiconductor structures 21.

Second, still as shown in FIG. 2A, before formation of contact window, form over coating layer 24 over coating layer 22. Where etching rate of over coating layer 24 is higher than etching rate of coating layer 22, or more specifically, lateral etching rate of over coating layer 24 is higher than lateral etching rate of coating layer 22. In addition, method of forming over coating layer 24 comprises chemical deposition method and physical vapor deposition method. Moreover, available material of over coating layer 24 comprises dielectric layer and oxide layer. Of course, adhesion between coating layer 22 and over coating layer 24 still is a restriction on selection of available material.

Figure 2B:
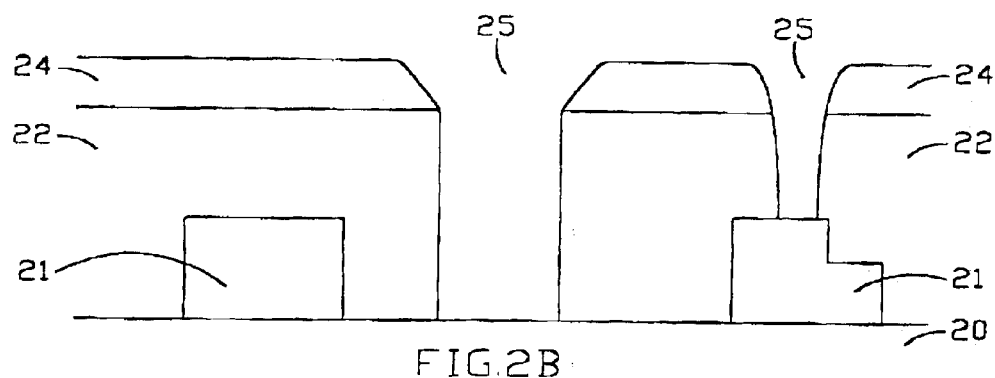

Third, as shown in FIG. 2B, form contact window 25 which usually is formed by etching process, especially by anisotropic etching. Where opening of contact window 25 locates on top surface of over coating layer 24 and contact window 25 land on either semiconductor structures 21 or on surface of wafer 20. Obviously, part of over coating layer 24 and part of coating layer 22 are removed to form contact window 25. Moreover, because etching rate of over coating layer 24 is higher than etching rate of coating layer 22, removed account of over coating layer 24 is larger than removing account of coating layer 22. In addition, removed account also is proportional to removing period. Therefore, upper part of contact window 25, especially part of contact window 25 in over coating layer 24, is outwardly widened. Further, the outward shape could be oblique, crooked, or smooth, depends on details of process to form contact window 25, and the invention only requires an outward shape but is not limited by details of outward shape.

Figure 1A:
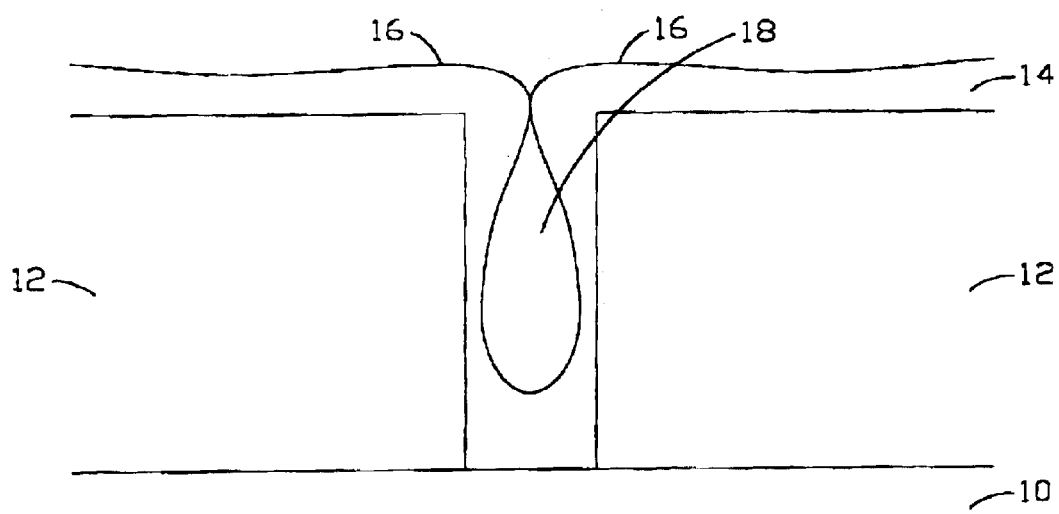
FIG. 1A to FIG. 1B show cross sectional views which illustrate different conventional contact windows.
Figure 1B:
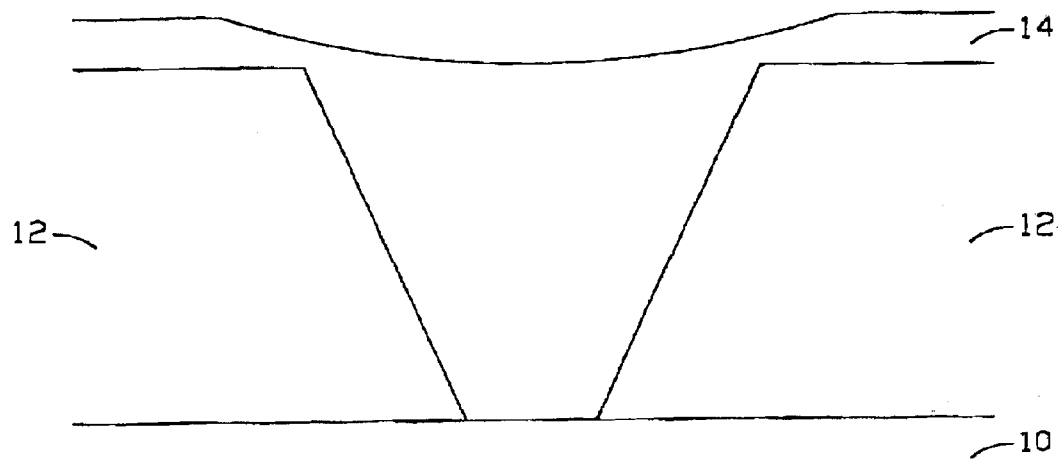
Figure 2C:
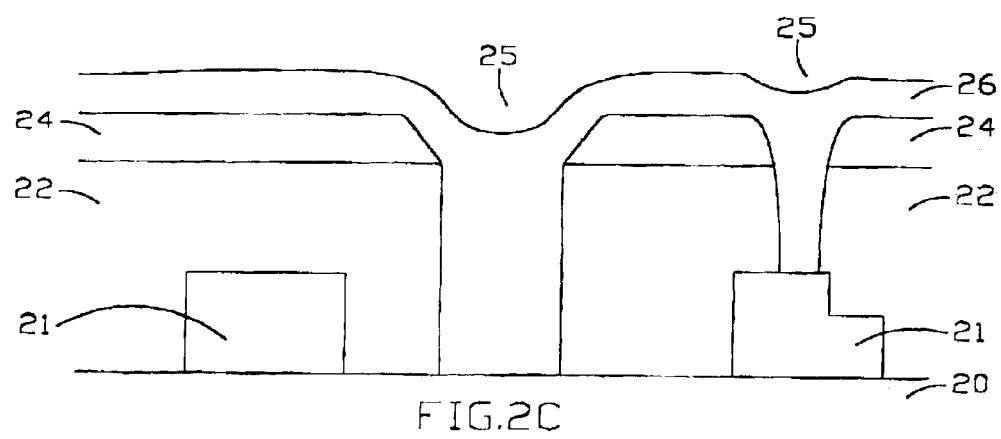

Significantly, as FIG. 2B shows, the shape of contact window 25 is beneficial for filling material 26 and the contact is formed as shown in FIG. 2C. Obviously, by comparing FIG. 2C with FIG. 1A, the probability of forming over hangs and/or voids is strongly reduced by the outward shape of contact window 25. Further, By comparing FIG. 2C with FIG. 1B, it is clear that this invention only increases cross-sectional area of upper part of contact window 25 but conventional method increases cross-sectional area of all contact window, and then occupied area of this invention is obviously smaller than occupied area of conventional method whenever cross-section area of bottom of contact window is fixed. Moreover, the difference is more significantly while the desired height of this contact window is increased.

Furthermore, because different etching rate between coating layer and over coating layer is used to let contact window with non-uniform cross-sectional area, it is reasonable that non-uniform cross-sectional area could be achieved by other reasons. For example, whenever viscosity of over coating layer is higher than viscosity of coating layer, because material with high viscosity is easy to be deformed while is forced, formed contact window also has a narrow lower part in coating layer and a wider and outwardly widened upper part in over coating layer.

Certainly, because contact window must be formed in both coating layer and over coating layer at the same time with an outwardly widened shape of upper part, the difference of etching rate, or the difference of viscosity, also is finite and is not limited. For example, the difference of etching rate could not be so larger to let coating layer behave as etch stop layer of over coating layer, otherwise, all over coating layer would be consumed before contact hole is formed in underlying coating layer.

Another embodiment is a practical application of this invention: a method for forming a metal plug in an interlayer dielectric. The method comprising following essential steps:

First of all, form a dielectric layer over surface of wafer, where surface of wafer comprises comprise gate, electrode of capacitor, isolation layer, multilevel interconnects, and other semiconductor structures. Moreover, thickness of dielectric layer is not less than heights of these semiconductor structures. Then, planarize the surface of dielectric layer by chemical mechanical polishing.

Next, an oxide layer is formed over dielectric layer to fill polishing scars for protecting metal short in following metallization process. Whereby, not only etching rate of oxide layer also is higher than etching rate of dielectric layer, but also adhesion between dielectric layer and oxide layer also should be enough to let over coating layer strongly coat coating layer. Furthermore, method of forming over coating layer comprises chemical deposition method and physical vapor deposition method. In additional, dielectric layer is formed by an annealing oxide layer with an annealing temperature about 800° C., and etching rate of annealing oxide layer is higher then oxide layer for density of annealing oxide layer is increased by annealing.

And then, form a contact window by etching process, especially by isotropic etching. Where opening of contact window locates on top surface of over coating layer and contact window lands on wafer. Obviously, part of oxide layer and part of dielectric layer are removed by etching and then contact window is formed. Further, because etching rate of dielectric layer is higher than etching rate of oxide layer, removed account is different between oxide layer and dielectric layer. Thus, not only upper cross-sectional area of contact window is wider than lower cross-sectional area of contact window, but also shape of opening is outward widened, such as outwardly oblique, outwardly crooked, or outwardly smooth. Indisputably, the shape of contact is profitable for material filling and then the probability of forming of overhang and voids is effectively decreased.

Although specific embodiments have been illustrated and described, it will be obvious to those skilled in the art that various modifications may be made without departing from what is intended to be limited solely by the appended claims.

What is claimed is:

1. A method for forming a contact window, said method comprise:

forming a plurality of semiconductor structures on a wafer;

forming a coating layer over the surface of said wafer, where the thickness of said coating layer is not less than the heights of said semiconductor structures;

forming an over coating layer over said coating layer, wherein the etching rate of said over coating layer is higher than the etching rate of said coating layer; and forming said contact window in both said over coating layer and said coating layer by a single isotropic etching process, wherein upper part of said contact window is outwardly widened.

2. The method of claim 1, wherein the lateral etching rate of said over coating layer is higher than the lateral etching rate of said coating layer.

3. The method of claim 1, wherein upper part of said contact window is outwardly oblique.

4. The method of claim 1, wherein upper part of said contact window is outwardly crooked.

5. The method of claim 1, wherein upper part of said contact window is outwardly smooth.

6. The method of claim 1, wherein an opening of said contact window locates on top surface of said over coating layer and said contact window lands on said semiconductor structures.

7. The method of claim 1, wherein an opening of said contact window locates on top surface of said over coating layer and said contact window lands on said wafer.

8. The method according to claim 1, wherein said semiconductor structures comprises gate, electrode of capacitor, isolation layer and multilevel interconnects.

9. The method according to claim 1, wherein said coating layer comprises dielectric layer.

10. The method according to claim 1, wherein material of said over coating layer is chosen from the group consisting of following: oxide and dielectric.

11. A method for forming a metal plug, said method comprising:

forming a dielectric layer over a wafer;

planarizing the surface of said dielectric layer by a chemical mechanical polishing;

forming an oxide layer over said dielectric layer, where said oxide layer filling a plurality of polishing scars and said oxide layer having an etching rate which is higher than an etching rate of said dielectric layer;

forming a contact window in both said oxide layer and said dielectric layer by a single isotropic etching process, wherein upper part of said contact window is outwardly widen; and filling a metal in said contact window.

12. The method of claim 11, wherein upper part of said contact window is outwardly oblique.

13. The method of claim 11, wherein upper part of said contact window is outwardly crooked.

14. The method of claim 11, wherein upper part of said contact window is outwardly smooth.

15. The method of claim 11, wherein an opening of said contact window locates on top surface of said oxide layer and said contact window lands on said wafer.

16. The method according to claim 11, wherein said dielectric layer is an annealing oxide layer, said annealing is formed in about 800° C. and then etching rate of said annealing oxide layer is higher then said oxide layer.

* * * * *